United States Patent [19]

Yilmaz

[11] Patent Number: 4,809,045
[45] Date of Patent: Feb. 28, 1989

[54] INSULATED GATE DEVICE
[75] Inventor: Hamza Yilmaz, Dewitt, N.Y.
[73] Assignee: General Electric Company, Fairfield, Conn.
[21] Appl. No.: 781,381
[22] Filed: Sep. 30, 1985
[51] Int. Cl.[4] .................... H01L 29/78; H01L 49/00
[52] U.S. Cl. ................... 357/23.4; 357/23.8; 357/23.14; 357/86
[58] Field of Search .................. 357/23.4, 23.8, 23.14, 357/86

[56] References Cited

U.S. PATENT DOCUMENTS

| 4,345,265 | 8/1982 | Blanchard | 357/23.8 |
|---|---|---|---|
| 4,376,286 | 3/1983 | Lidow et al. | 357/23.8 |
| 4,402,003 | 8/1983 | Blanchard | 357/86 |
| 4,417,385 | 11/1983 | Temple | 357/23.8 |
| 4,443,931 | 4/1984 | Baliga et al. | 357/86 |
| 4,587,713 | 5/1986 | Goodman et al. | 357/23.4 |

FOREIGN PATENT DOCUMENTS

| 0022001 | 1/1981 | European Pat. Off. | 357/23.8 |
|---|---|---|---|
| 2088631 | 6/1982 | United Kingdom | 357/38 T |
| 2161649 | 1/1986 | United Kingdom | 357/23.8 |

Primary Examiner—Martin H. Edlow
Assistant Examiner—Donald J. Featherstone
Attorney, Agent, or Firm—K. R. Glick

[57] ABSTRACT

An insulated gate device includes at least one cell having base and emitter region surfaces disposed in ohmic contact with a metallic emitter electrode. The cell is constructed to provide a larger ratio of base region surface area to emitter region surface area in contact with the emitter electrode than is found in the prior art. The cell is further constructed to provide paths for reverse current flow from a drift region through the base region and to the emitter electrode; these paths being spaced form the cell's emitter-base junction.

14 Claims, 3 Drawing Sheets

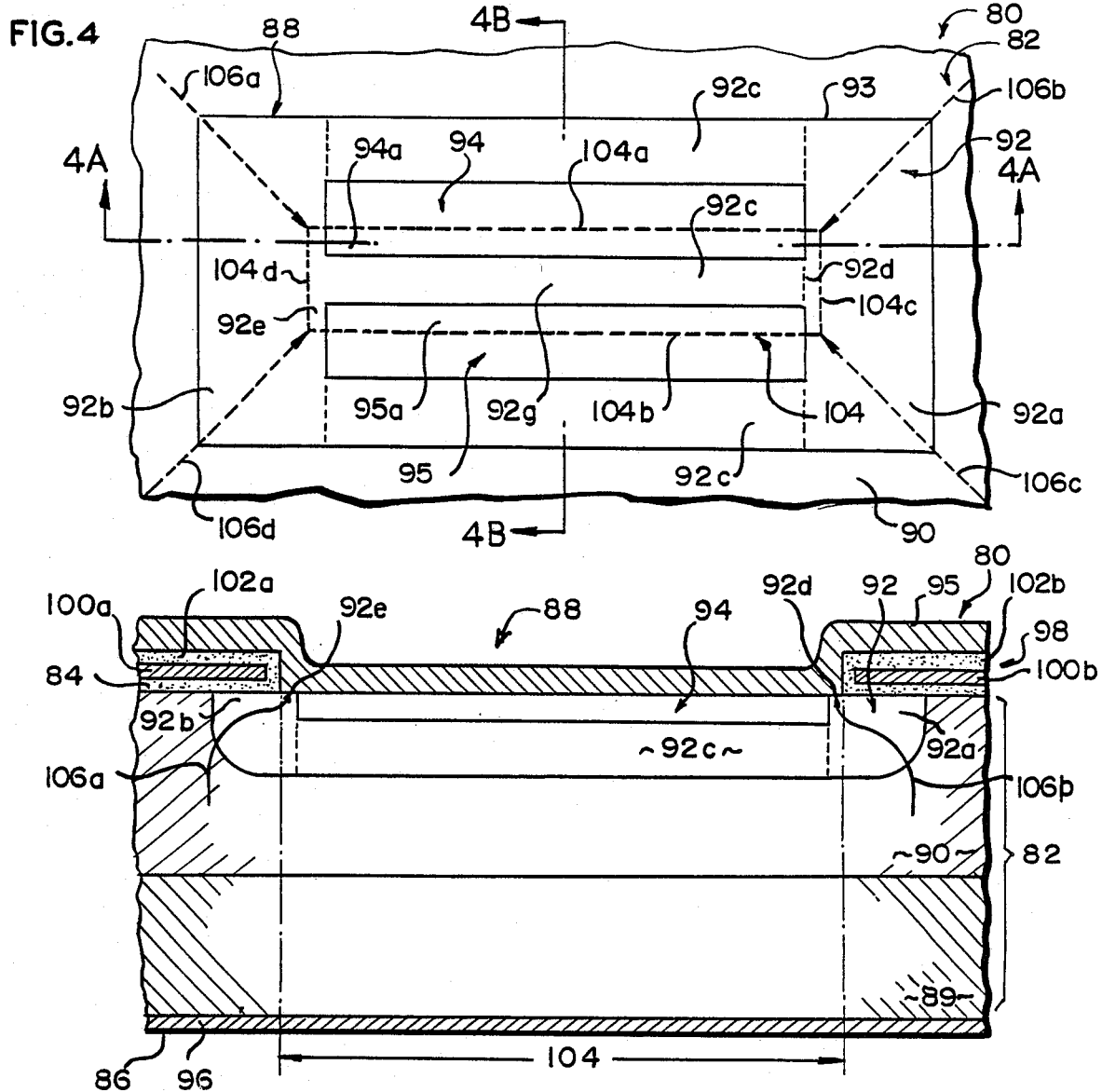
FIG.4
FIG.4A
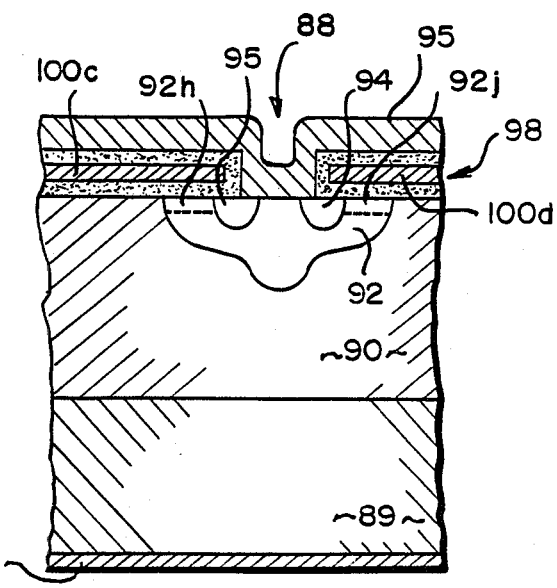
FIG.4B

INSULATED GATE DEVICE

The present invention relates in general to semiconductor devices and more specifically to the structure of an insulated gate semiconductor device.

BACKGROUND OF THE INVENTION

A typical insulated gate device (IGD) is the insulated gate transistor (IGT), a device capable of controlling a high forward current with a low bias voltage applied to its gate electrode. This gate control characteristic makes the IGT particularly useful for power control and current switching applications.

A typical IGT comprises a plurality of small, parallel-connected cells fabricated in a semiconductor substrate or wafer. Each cell comprises, in series, adjacent collector, drift, base and emitter regions of alternate conductivity types. A gate electrode is insulatively spaced from the semiconductor substrate by an insulating region which includes a plurality of contact windows, each contact window overlying one of the cells and exposing adjacent emitter and base region surfaces. Emitter and collector electrodes are connected, respectively, at opposite ends of each cell, and conduct the forward current into and out of the cell, the magnitude of the forward current being controlled by the magnitude of a bias voltage applied to the gate electrode. A typical collector electrode comprises a conductive layer in continuous ohmic contact with a single, distributed collector region shared by the plurality o cells in the wafer. In contrast, a typical emitter electrode comprises a conductive layer which makes ohmic contact with each cell at the emitter and base region surfaces exposed within each contact window.

As is known to those skilled in the art, the emitter, base and drift regions of the typical IGT cell form a first, inherent bipolar transistor, while the base, drift and collector regions form a second, inherent bipolar transistor. These first and second inherent bipolar transistors have respective forward current gains of α1 and α2, and by the nature of their construction are regeneratively coupled to form a parasitic thyristor which is susceptible to latching when the sum of these forward current gains equals or exceeds unity (i.e. $\alpha 1 + \alpha 2 \geq 1$). When the parasitic thyristor in any one of the plurality of cells latches, the IGT loses gate control of the forward current, and can only be turned off through an external action such as commutation.

As is further known to those skilled in the art, one cause of parasitic thyristor latching within a cell is a reverse current flow of carriers of the base region majority concentration type from the drift region to the emitter electrode through the base region and along the emitter-base junction of the first inherent bipolar transistor. This reverse current, for example, comprises hole current carriers in an IGT having a P-conductivity type base region. This reverse current flow produces a voltage drop along the emitter-base junction which, when it exceeds a threshold voltage, forward biases this junction, thereby causing the forward current gain of the first bipolar transistor to substantially increase. Consequently, the likelihood of the forward current gains of the first and second inherent bipolar transistors exceeding unity increases substantially, as does the accompanying latching of the parasitic thyristor described above.

The voltage drop developed along the emitter-base junction of a cell can, for analytical purposes, be expressed as the product of the parasitic current flow and the resistance of the base region adjacent this junction, this base region resistance commonly being referred to as the "well resistance". While the magnitude of the reverse current varies proportionately with the magnitude of the forward, main device current during a forward conducting mode of device operation, it typically exhibits a substantially large increase during device turnoff. The metallic emitter electrode, by contacting the semiconductor base region surface exposed within the contact window, reduces the well resistance of the cell, thereby increasing the magnitude of the reverse current flow and hence the magnitude of the forward, main device current which the IGT can turn off without causing the inherent thyristor to latch.

Prior art devices are typically constructed having a plurality of small, square or circular contact windows, each of which exposes a similarly sized and shaped cell having a cell emitter region disposed continuously along its window periphery. It has been discovered that these small contact windows limit the contact area between the emitter electrode and the exposed base region surface of the cell, thereby limiting the decrease in the well resistance effected by the contact between the metal emitter electrode and the exposed surface of the semiconductor base region. Further, the limited emitter electrode-base region contact area creates a high density of reverse current flowing through the base region. This is found to be particularly so in the case of a square contact window configuration, as the flow of reverse current tends to crowd the corners of the emitter-base junction. The combined effects of the still relatively high well resistance and the high reverse current density act to increase the voltage drop along the emitter-base junctions for a given magnitude of reverse current. Since the magnitude of reverse current is a function of the forward current, the IGT becomes unduly limited in the magnitude of forward current it can reliably gate control and interrupt during turn off.

One known method of decreasing the well resistance of the cells in an IGT is to deposit a high concentration of majority carriers deeply into the base region of each cell under its emitter-base junction. This deposition creates a low-resistance path for the reverse current flow. However, this deposition requires a substantial number of additional process steps and does not produce a sufficiently large decrease in the well resistance to significantly improve the IGT operating characteristics. Further, it does not reduce the problem of reverse current crowding adjacent the emitter-base junction.

OBJECTS OF THE INVENTION

A principal object of the present invention is to provide a new and improved insulated gate semiconductor device capable of reliably controlling a forward current of a relatively high magnitude in comparison to prior art devices.

Another object of the present invention is to provide an insulated gate semiconductor device having a relatively large area of ohmic contact between an emitter electrode and a base region surface of each of a plurality of cells conducting a forward current.

Yet another object of the present invention is to provide an insulated gate semiconductor device wherein each cell is configured to establish at least one path for a reverse current from a drift region to an emitter electrode through a base region which is spaced from any emitter-base junction.

A further object of the present invention is provide an insulated gate semiconductor device wherein the electrical resistance of the cell base regions adjacent the emitter-base junctions is reduced.

A more specific object of the present invention is to provide a new and improved insulated gate transistor having a low well resistance and reduced reverse current crowding proximate the emitter-base junctions of its cells, and hence which is capable of reliably controlling a forward current of a higher magnitude than a typical prior art insulated gate transistor.

SUMMARY

These and other objects of the invention are achieved through the use of a new and improved insulated gate device (IGD) such as an insulated gate transistor (IGT) including a plurality of cells, each having a lower well resistance and less reverse current crowding along its emitter-base junction. These characteristics act separately and in combination to increase the magnitude of forward current which an IGT can reliably gate control and turn off.

In accordance with a preferred embodiment of the present invention, an IGT is fabricated on a single semiconductor chip having a relatively fewer number of larger, rectangular cells than is typically found in the prior art. Each larger cell is overlain by a correspondingly larger contact window formed in a gate structure and is configured to expose within this window a larger ratio of base region surface area to emitter region surface area than is found in the prior art. Each cell further includes a base region end portion situated proximate each contact window end to present surfaces thereof adjacent each contact window end. The larger contact window in combination with the increased percentage of exposed base region surface area contacted by the emitter electrode acts to substantially lower the well resistance in each cell. The positioning of the end portions of the base region to present emitter electrode contacting surfaces adjacent the ends of the contact window acts to provide reverse current paths well spaced from the emitter-base junction in each cell, thereby reducing the possibility of spurious forward biasing of the emitter-base junction.

The size and shape of each cell contact window, as well as the size and shape of the emitter and base regions and their respective surfaces exposed within the contact window, are chosen to enhance selected operating characteristics of the IGT. Further, while the present invention is described above with respect to IGTs, it is not so limited. It may be used, for example, to enhance the operating characteristics of metal-oxide-semiconductor field-effect transistors (MOSFETs).

BRIEF DESCRIPTION OF THE DRAWINGS

While the specification concludes with claims defining the features of the invention that are regarded as novel, it is believed that the invention, together with further objects thereof, will be better understood from a consideration of the following description in conjunction with the drawing figures, in which:

FIG. 4 is a plan view illustrating selected features of an IGT constructed in accordance with the present invention;

FIG. 4A is a cross-sectional view taken along line 4A—4A of FIG. 4;

FIG. 4B is a cross-sectional view taken along line 4B—4B of FIG. 4;

DETAILED DESCRIPTION

Figure 1:
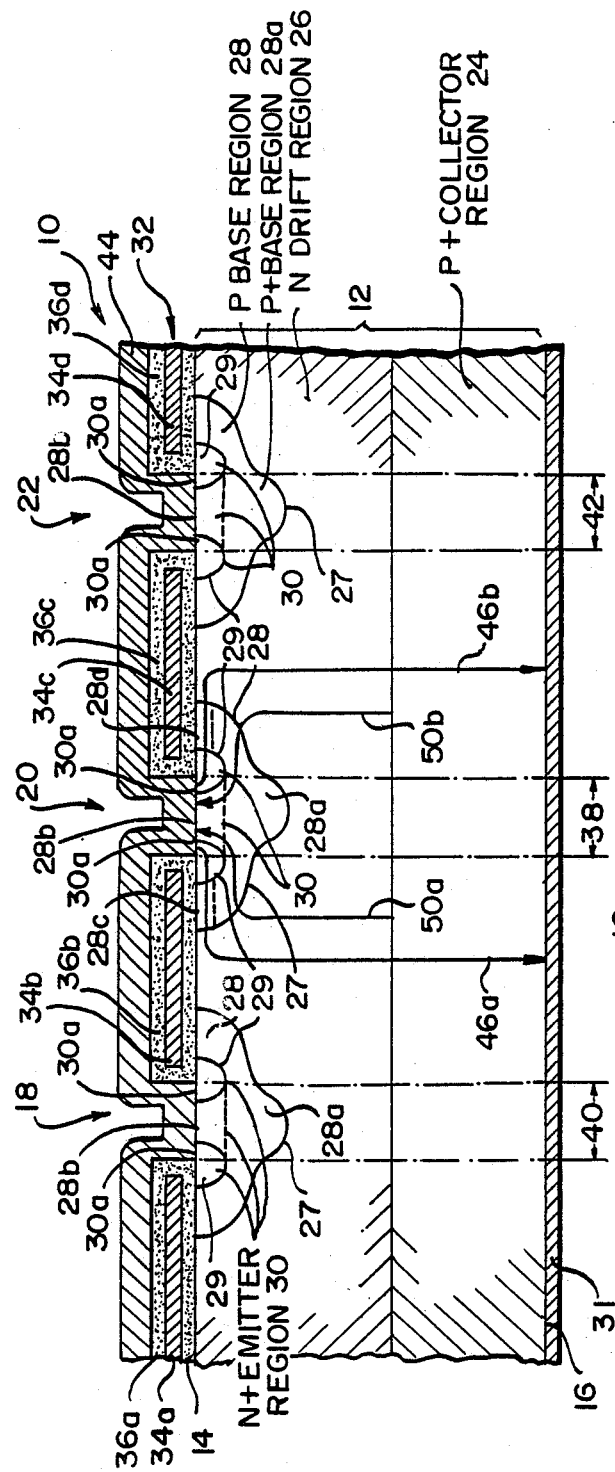
FIG. 1 is a cross-sectional view of an insulated gate transistor (IGT) constructed in accordance with the prior art.

Referring now to the drawings, FIG. 1 shows a portion of a prior art IGT 10 implemented in a silicon semiconductor substrate or wafer 12 having opposing major surfaces 14 and 16 and including three substantially identical cells, indicated generally at 18, 20 and 22, respectively. Each of cells 18, 20 and 22 is oriented orthogonally to major surface 14 and includes, in series; an adjacent portion of a P+ (i.e. "+" and "−" representing relative dopant concentrations) collector region 24, an adjacent portion of an N drift region 26, a P base region 28 extending from major surface 14 into drift region 26 and forming a base-drift junction 27 therewith, and an N+ emitter region 30 extending from major surface 14 into base region 28 and forming an emitter-base junction 29 therewith. Each cell base region includes a central P+region extending deeply into drift region 26, indicated at 28a.

A collector electrode 31, preferably comprising a metal, is disposed in ohmic contact with collector region 24 at major surface 16. A gate structure 32 overlies major wafer surface 14 and includes a gate electrode in the form of a distributed, electrically conductive layer overlying major surface 14 and insulatively spaced therefrom by a surrounding insulating region. Portions of this gate electrode are indicated at 34a–34d, while portions of the insulating region are indicated at 36a–36d in FIG. 1. The gate electrode preferrably comprises a polysilicon material, while the insulating region preferrably comprises silicon dioxide. Gate structure 32 is further formed to provide a plurality of contact windows defined between the edges of adjacent insulating region portions, one contact window overlying each of cells 18, 20 and 22. Thus, a contact window 38, indicated between the vertical edges of insulating region portions 36b and 36c, overlies cell 20 and exposes (i.e. looking downward from a plan view of surface 14) surfaces 30a of emitter region 30 and surface 28b of base region 28. Similarly, contact windows 40 and 42 overlie cells 18 and 22, respectively, and expose corresponding surfaces of these cells.

Cells such as cells 18, 20 and 22 are typically fabricated during the construction of an IGT by first forming gate structure 32 over surface 14 of wafer 12 in which drift region 26 and collector region 24 have been previously formed. Next, base regions 28 are formed through the respective contact windows into major surface 14, and thus extend from the major surface into the drift region. Subsequent to the formation of the base regions, appropriate masking is used to form emitter regions 30, also through the respective contact windows and into major surface 14, these emitter regions thus extending from major surface 14 into base regions 28. Finally, appropriate masking is used to form deep P+ regions 28a, also through major surface 14 and into the base and drift regions. As will be appreciated through a consideration of the device fabrication process, the size and configuration of the cell base and emitter regions, as well as their respective surfaces exposed through the overlying contact windows, can be selected and controlled during this fabrication process.

A distributed emitter electrode 44, preferrably comprising a metallic layer, overlies insulating region portions 36a-36d and makes ohmic contact with the emitter and base region surfaces of the particular cell exposed within each contact window. For example, at cell 20 emitter electrode 44 is seen to occupy contact window 38 and make ohmic contact with exposed emitter region surfaces 30a and exposed base region surface 28b. Corresponding contact is made between emitter electrode 44 and the exposed base and emitter region surfaces of cells 18 and 22.

The operation of IGT 10 can be understood through a consideration of cell 20 of FIG. 1, all typical cells operating in an identical manner. To initiate a forward conducting mode of operation, an appropriate bias voltage is applied to the distributed gate electrode by means not shown. When this bias voltage exceeds a threshold level, an electrical field is established in base region 28, thereby creating an N conductivity type channel in the base region, two portions of which are indicated at 28c and 28d, these channel portions being situated adjacent major surface 14 and beneath gate electrode portions 34b and 34c, respectively. Collector electrode 31 is concomitantly biased to a positive potential with respect to emitter electrode 44, and electron current paths for the main device current are thus developed through channel portion 28c and 28d between these electrodes along the paths indicated by arrows 46a and 46b. As mentioned above, a reverse hole current flow proportional to the magnitude of the forward electron current flow is simultaneously established along the paths indicated at 50a and 50b. These reverse hole current paths are situated adjacent emitter base junction 29 and terminate at emitter electrode 44, but do not enter emitter region 30.

Figure 2:
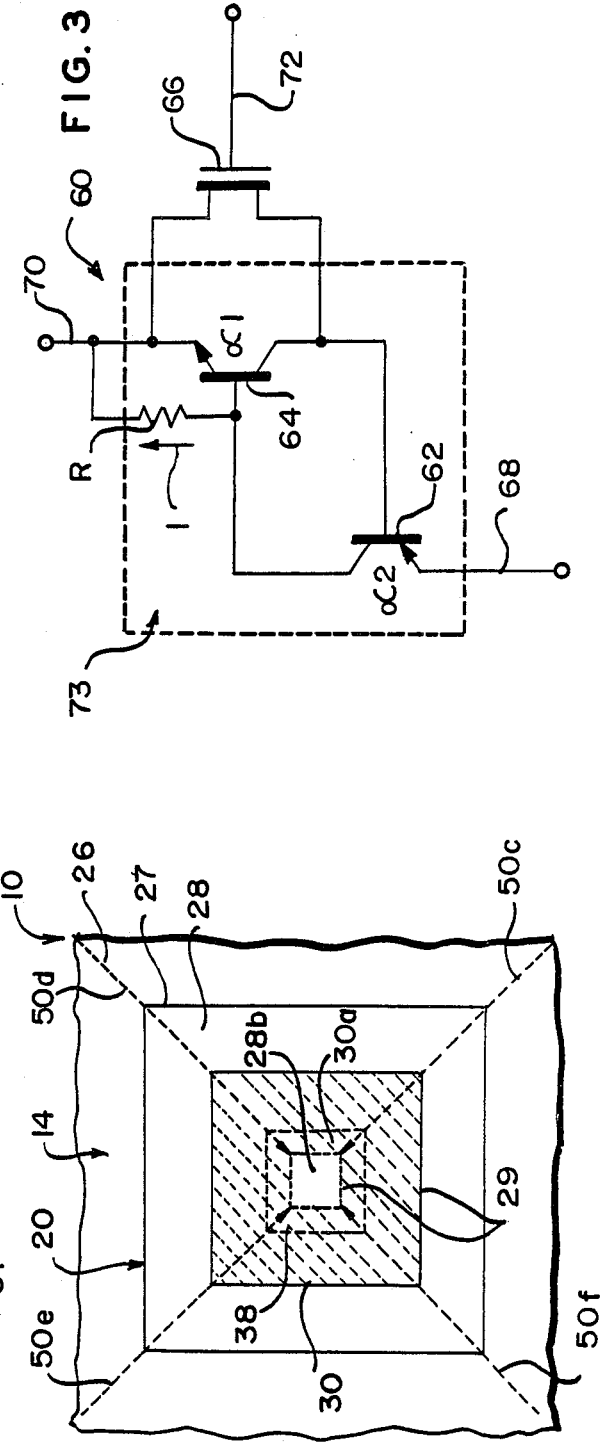
FIG. 2 is a plan view illustrating selected features of the IGT of FIG. 1.

FIG. 2 is a plan view of cell 20 of IGT 10 having emitter electrode 44 and gate structure 32 removed to illustrate details of cell 20 at major surface 14. Base region 28 is seen to have a generally square surface bounded by base-drift junction 27 and surrounded by drift region 26. Emitter region 30, cross-hatched to show its exposed surface shape, is seen to also have a generally square surface including a centrally disposed aperture defined by an inner edge of base-emitter junction 29, this aperture exposing small, square surface portion 28b of base region 28. Emitter region 30 is further bounded by an outer edge of emitter-base junction 29 and surrounded by base region 28. Rectangular contact window 38, shown in dash line, exposes base region surface 28b and emitter region surface 30a for contact with emitter electrode 44 as shown in FIG. 1.

Figure 3:
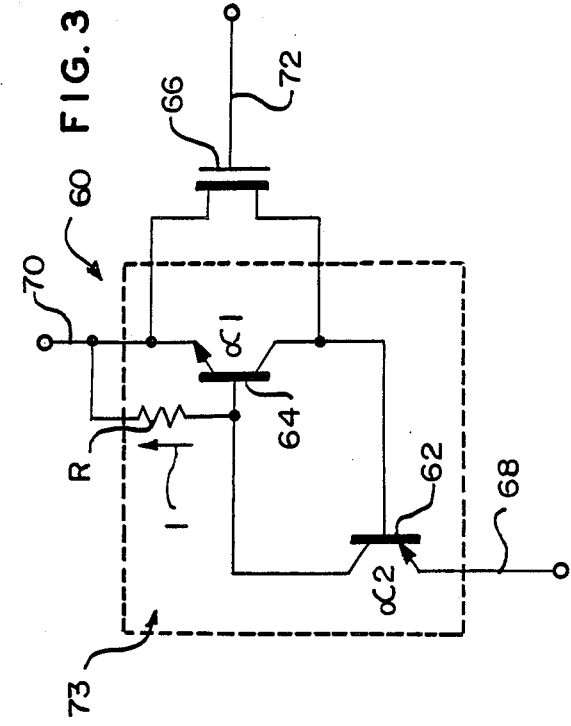
FIG. 3 is a schematic, electrical circuit representation of an IGT.

The disadvantages of the prior art structure of FIGS. 1 and 2, as well as the features and advantages of the present invention described below, will best be understood after a consideration of FIG. 3 showing an electrical circuit 60 which comprises a bipolar transistor model of cell 20 of IGT 10 (FIGS. 1 and 2). Correlating the structure of cell 20 with the components of circuit 60, collector region 24, drift region 26 and base region 28 form a PNP bipolar transistor 62. Similarly, drift region 26, base region 28 and emitter region 30 form an NPN bipolar transistor 64. Gate structure 32 comprises a metal-oxide semiconductor field-effect transistor (MOSFET) 66, and collector electrode 31, emitter electrode 44 and gate electrode portions 34b-34c comprise terminals 68, 70 and 72, respectively. Transistors 62 and 64 have forward current gains of $\alpha 2$ and $\alpha 1$, respectively, and are regeneratively coupled to form a parasitic thyristor 73. A resistor R represents the well resistance in base region 28 adjacent emitter-base junction 29, and a current I represents the reverse current flowing through this resistance. As the magnitude of reverse current I increases, the emitter-base junction of transistor 64 becomes increasingly forward biased until, when a threshold voltage $V_{TH}$ is reached, the junction goes into conduction. When conduction occurs, $\alpha 1$ increases, the formula $\alpha 1 + \alpha 2 \geq 1$ becomes true, and parasitic thyristor 73 latches. Threshold voltage $V_{TH}$ is determined by, among other factors: (1) the temperature of IGT 10, (2) the length of a minority carrier lifetime and (3) the gain of transistor 64. Because the metal comprising emitter electrode 44 has a lower resistance than the semiconductor material comprising base region 28, well resistance R is determined by, among other factors, the area of the surface of the semiconductor base region in ohmic contact with the emitter electrode.

Examining prior art cell 20 of FIGS. 1 and 2, it is seen that the base region surface 28b exposed within contact window 38 is small and essentially square. It has been discovered that such a cell geometry unduly limits the available area of contact between exposed base region surface 28b and emitter electrode 44 (FIG. 1), and therefore produces an unnecessarily high well resistance. Further, the detrimental effects of this high resistance are magnified at the corners of the base-emitter junction of cells formed in square contact windows such as 38 through a phenomenon known as "current crowding". As illustrated by the reverse current paths indicated at 50c-50f of FIG. 2, this reverse current, in flowing through the base region adjacent the emitter-base junction, has a tendency to crowd under the corners of this square junction enroute to the emitter electrode in ohmic contact with base region surface 28b. The voltage drop caused by this parasitic current flow is therefore higher at these corners, and thus there is a tendency to exceed the threshold voltage $V_{TH}$ of the emitter-base junction adjacent these corners sooner than at the emitter-base junction situated throughout the remainder of the cell.

In accordance with the present invention, and as will best be understood through a consideration of FIGS. 4-4B in light of FIGS. 1-3, the magnitude of well resistance R and the detrimental effects of the reverse current crowding are decreased by altering the configurations of the base and emitter regions of each cell. This decrease in the well resistance increases the magnitude of reverse current I which an IGT can accommodate before $V_{TH}$ is exceeded and parasitic thyristor 73 latches.

FIG. 4 is a plan view showing an IGT 80 having all features overlying a wafer 82 removed to illustrate surface details of a new and improved IGT cell 88. The dashed line rectangle represents the edges of a contact window 104 overlying cell 88 as defined by an aperture in an insulating region (not shown) and comprises a pair of elongated, longitudinally opposing sides 104a, 104b and a pair of transversely opposing ends 104c, 104d. Cell 88 includes a base region 92 shown to have a generally rectangular surface defined by a base-drift junction 93 and surrounded by a drift region 90. For purposes of explanation, base region 92 is shown to comprise end portions 92a and 92b, situated proximate contact window ends 104c and 104d, respectively, and an interconnecting center portion 92c. An emitter region 94 having a rectangular surface is situated in base region center portion 92c proximate contact window side 104a and includes a rectangular surface portion 94a disposed within the contact window and contiguous with window side 104a. A separate emitter region 95 also having a rectangular surface is situated in base region center portion 92c proximate contact window side 104b and includes a rectangular surface portion 95a disposed within the contact window contiguous with side 104b. Base region end portion 92a includes a rectangular surface portion 92d disposed within contact window 104 coextensively with window end 104c, while base region end portion 92b includes a rectangular surface portion 92e also disposed within contact window 104 and coextensive with window end 104d. Base region center portion 92c is seen to include a surface extending longitudinally through window 104 between emitter region surface portions 94a and 95a to connect base region end portion surfaces 92d and 92e. The conductivity types of the various regions of IGT 80 are the same as those of the corresponding regions of IGT 10 (FIGS. 1 and 2).

FIG. 4A shows wafer 82 to include a pair of opposing, major surfaces 84 and 86. Cell 88 is seen to be oriented orthogonally to major surface 84, base region 92 extending from surface 84 into drift region 90, while emitter region 94 extends from surface 84 into base region center portion 92c. A distributed collector region 89 is disposed adjacent drift region 90. A collector electrode 96, preferably comprising a metallic layer, is disposed in ohmic contact with collector region 89 at major substrate surface 86. A gate structure 98 overlies major wafer surface 84 and includes a gate electrode in the form of a distributed, electrically conductive layer overlying major surface 84 and insulatively spaced therefrom by a surrounding insulating region. Portions of this gate electrode are indicated at 100a-100b, while portions of the insulating region are indicated at 102a-102b. The gate electrode preferrably comprises a polysilicon material, while the insulating region preferrably comprises silicon dioxide. Gate structure 98 further includes contact window 104, indicated between the vertical edges of insulating region portions 102a and 102b, and exposing the base and emitter region surfaces described in FIG. 4. An emitter electrode 95, preferrably comprising a low-resistance metal, overlies the insulating region and is disposed in ohmic contact with these exposed base and emitter region surfaces.

FIG. 4B shows separate channel portions 92h and 92j formed in base region 92 when an electrical potential is applied to gate electrode portions 100c and 100d in the manner described in FIG. 1 above.

A feature of the invention which operates to significantly lower the well resistance (i.e. R of FIG. 3) of cell 88 is the increase in the base region surface area exposed within contact window 104. Comparing FIG. 4 and FIG. 2 (prior art), it is seen that the total base region surface area exposed within contact window 104 of the former comprises three rectangular portions having both a larger total area and a larger ratio of base to emitter region exposed surface area than in the case of small, square base region surface 28b exposed within the later. This increase in the base region surface in ohmic contact with the metallic emitter electrode 95 decreases the well resistance of the cells constructed in accordance with the present invention. Experimentation has shown that when the ratio of base region surface to emitter region surface exposed within a cell contact window is selected to be not less than ⅓, significant decreases in the well resistance of the cell result. This is in contrast to a typical ratio of 1/15 for the corresponding exposed surfaces of a prior art device such as that shown in FIG. 2. Experimentation has also shown that, using current, state-of-the-art fabrication techniques with the elongated, rectangular contact window geometry illustrated in FIGS. 4-4B, a base/emitter region surface area ratio of not less than ⅓ is most efficiently obtained by constructing the cells through contact windows having length/width aspect ratios of not less than 20.

A feature of the present invention which serves to reduce the detrimental effects of the reverse current crowding is the positioning of the end portions 92a and 92b of base region 92, and hence the positioning of their corresponding surfaces 92d and 92e, coextensive with contact window ends 104c and 104d, respectively. These base region end portions act to reduce the effects of the reverse current crowding phenomenon described above by removing the base-emitter junctions from the corners of the cell where current crowding is most pronounced. Consequently, paths for this atypically dense current are provided from drift region 90 to emitter electrode 95 through end portions 92a, 92b these paths being effectively well removed from the base-emitter junctions. FIG. 4A shows reverse current paths 106a and 106b while FIG. 4 shows paths 106A-106d. In accordance with the present invention, paths 106a-106d now terminate at the portions of the emitter electrode which make ohmic contact with base region surface portions 92d and 92e. Thus the dense reverse current flowing along paths 106a-106d does not flow along the cell emitter-base junctions, and the higher voltage developed as a result of the reverse current crowding does not have the detrimental effect of forward biasing the corners of the emitter-base junction in the manner described with respect to FIG. 2 above. Hence IGT 80, constructed in accordance with the present invention, can reliably gate control and turn off a higher main device current than an IGT constructed in accordance with the prior art.

Figure 5:
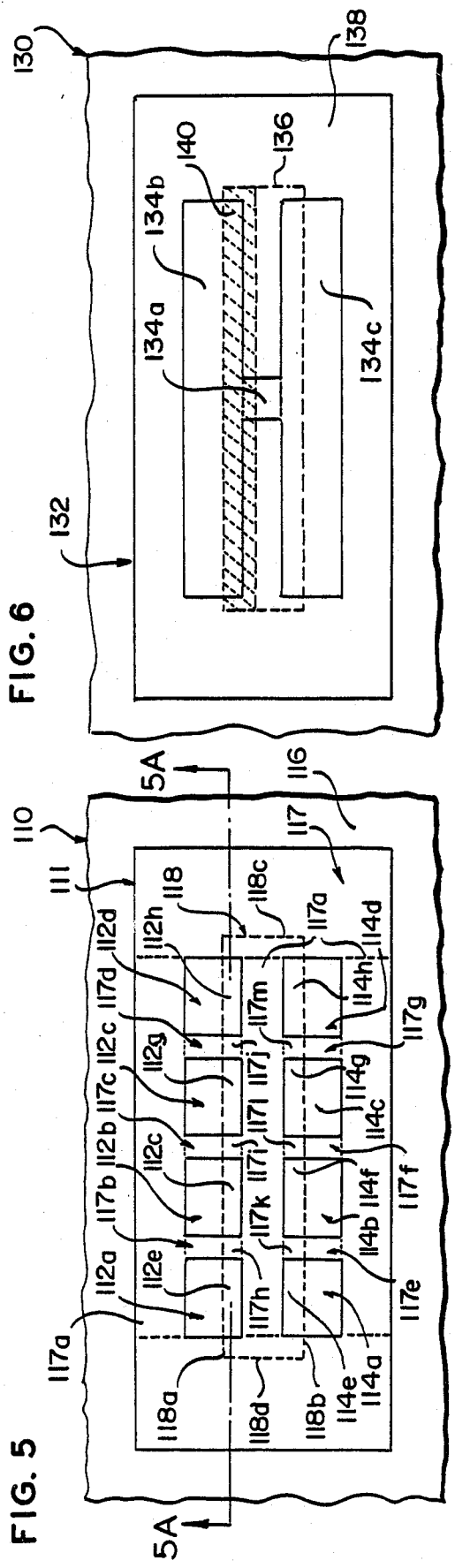
FIG. 5 is a plan view illustrating selected features of an IGT constructed in accordance with a first alternate embodiment of the invention.

FIG. 5 shows a plan view of a portion of an IGT 110, including a cell 111 identical in structure to cell 88 of IGT 80 (FIGS. 4-4B) with the exception of the structure of emitter regions 112a-112d and 114a-114d. Thus, IGT 110 includes a drift region 116 surrounding a base region 117 having a center portion 117a. A rectangular contact window 118, shown in dash line, has longitudinally opposing sides 118a, 118b and transversely opposing ends 118c, 118d, and exposes portions of the base and emitter region surfaces. In this alternate embodiment, the emitter region proximate contact window side 118a comprises four separate, longitudinally spaced segments 112a-112d, each segment having a corresponding rectangular surface portion 112e–112h contained within contact window 118 and situated contiguous with window side 118a. Similarly, an emitter region situated proximate contact window side 118b also comprises four separate, longitudinally spaced segments 114a–114d, having respective rectangular surfaces 114e–114h situated contiguous with window side 118b and in transversely opposed relation with emitter segments 112e–112h. Base region center portion 117a includes a separate lateral extension disposed between each longitudinally adjacent pair of emitter region segments, these extensions being indicated at 117b–117g. Exposed within contact window 118, each extension 117e–117g includes a rectangular surface portion 117h–117m, respectively, situated between the surfaces of the emitter region segments and connecting with the surface of center portion 117a.

Figure 5A:
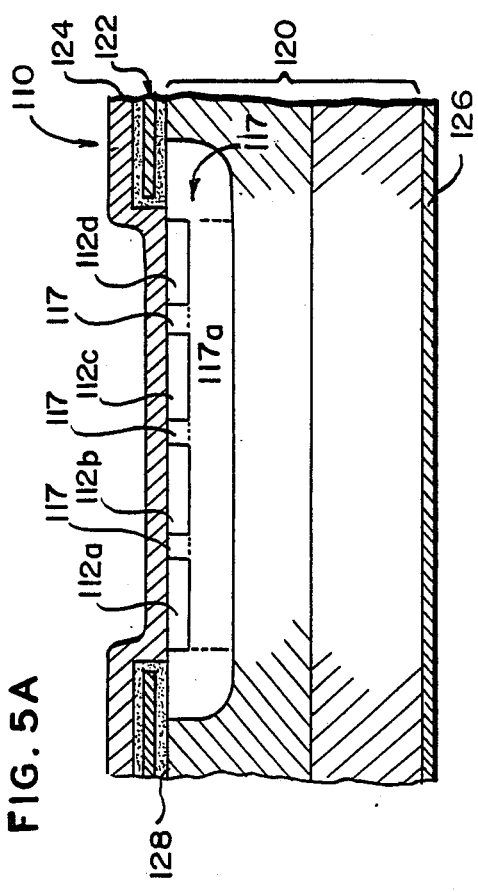
FIG. 5A is a cross-sectional view taken along line 5A—5A of FIG. 5.

FIG. 5A shows IGT 110 to include a wafer 120, gate structure 122, emitter electrode 124 and collector electrode 126 disposed identically to the corresponding features of IGT 88 of FIGS. 4–4B. Emitter region segments 112a–112d are seen to extend from a major surface 128 of wafer 120 into base region center portion 117a, and to be spaced by base region center portion extensions 117b–117d. It will be appreciated that a transverse cross-section of IGT 110 would reveal a structure substantially identical to that shown in FIG. 4A, with the exception of the discontinuities in the emitter regions of IGT 110.

In operation, as will be appreciated from a comparison of cell 111 of FIG. 5 with cell 88 of FIG. 4, the former has a larger ratio of base/emitter region surface area exposed by its corresponding contact window, said ratio being increased by exposed surface portions 117h–117m of base region extensions 117e–117g. Accordingly, for the reasons described above, IGT 110 has a lower well resistance than does IGT 88. However, this increase in base region surface area is obtained at the expense of a reduction in the cross-sectional area of the channel, or what is commonly termed "MOSFET periphery". It will be appreciated that increasing the volume of base region produces a reduction in the volume of emitter region, and that this decrease in emitter region volume imposes a decrease in the cross-sectional areas of the device channels (i.e. channels 92h and 92j of FIG. 4C). Hence, tradeoffs must be made between reduced well resistance and increased MOSFET periphery when this alternate embodiment of the invention is employed.

Figure 6:
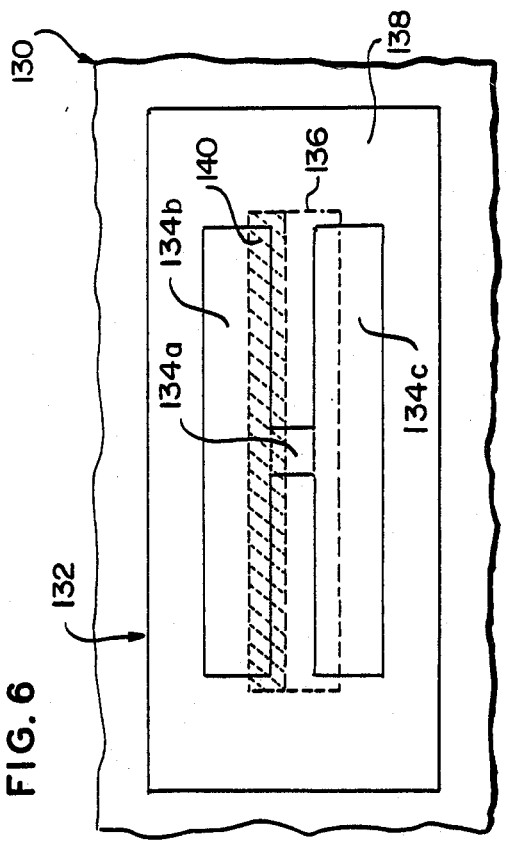
FIG. 6 is a plan view illustrating selected features of an IGT constructed in accordance with a second alternate embodiment of the invention.

FIG. 6 shows a second alternate embodiment of the invention comprising an IGT 130 including a cell 132 which is identical to cell 80 depicted in FIGS. 4–4B except for the addition of an emitter region bridge portion 134a situated within a base region 138 and connecting separate emitter portions 134b and 134c. This bridge portion 134a extends laterally across a contact window 136, shown in dashed line, between emitter region side portions 134b and 134c, and includes a surface interrupting the surface of base region 138. The function of bridge portion 134a is appreciated through a consideration of a cross-hatched portion 140 of contact window 136, which represents an area of ohmic contact the exposed cell surfaces might make with a misaligned emitter electrode. Such misalignment, wherein an emitter electrode portion doesn't fill an entire contact window, is commonly caused by a mask misalignment during the device fabrication process. From a consideration of FIG. 4B it will be appreciated that such a misalignment could render inactive a portion of a cell including an emitter region side portion not contacted by a misaligned emitter electrode. Bridge portion 134a functions to electrically connect what would otherwise be isolated emitter region side portions 134b and 134c, thereby insuring that the entire cell will be active, even in the event of a misaligned emitter electrode.

Figure 7:
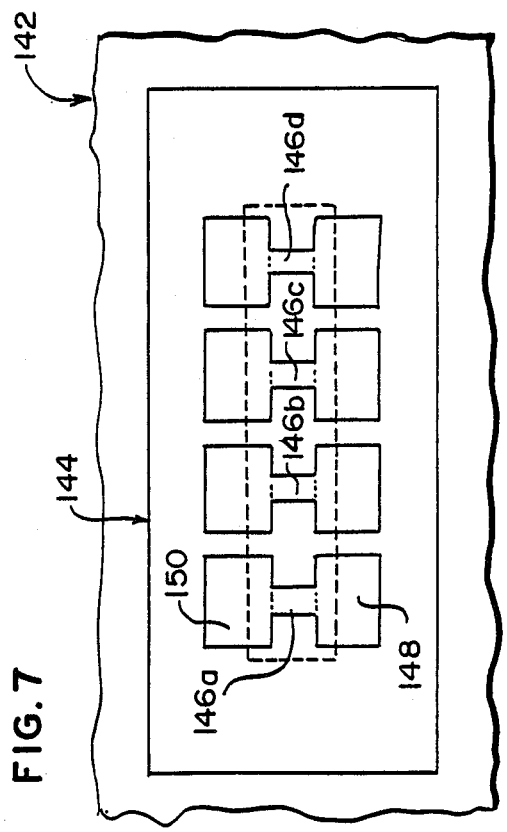
FIG. 7 is a plan view illustrating selected features of an IGT constructed in accordance with a third alternate embodiment of the invention.

FIG. 7 shows a third alternate embodiment of the invention including an IGT 142 having a cell 144 which is identical to cell 110 of FIGS. 5–5B except for indicated at 146a–146d respectively, each of which connects a pair of laterally opposing, emitter region side segments. Thus, emitter region bridge portion 146a, for example, interconnects otherwise separate emitter region side segments 148 and 150. These bridge portions 146a–146d perform the same function as bridge portion 124 of FIG. 6.

While the invention has been so far described with reference to an IGT, it also has application in other insulated gate devices such as a power MOSFET. The typical power MOSFET is identical to IGT 10 of FIG. 1, with the substitution of an N+ anode region for P+ collector region 24. As will be appreciated by those skilled in the art, the source, body and drain regions of a power MOSFET correspond to the emitter, base and drain regions, respectively, of an IGT. Similarly, the source, gate and drain electrodes of a MOSFET correspond to the emitter, gate and collector electrodes of an IGT.

The operation of a power MOSFET typically includes a mode wherein carriers are injected from the body region into the drain region, and another mode wherein these stored carriers are drained, through the source region along the body-source junction to the source electrode, such as to constitute a reverse current analogous to the reverse current of an IGT. During this draining of the reverse current, a single bipolar transistor inherent in the MOSFET structure is susceptible to turn-on caused by a lateral voltage developed in the MOSFET well adjacent the source-body junction. Such a turn-on causes failure of the MOSFET. By constructing the MOSFET cells in accordance with the present invention, the well resistance is lowered and the harmful effects of the reverse current are minimized, thereby increasing the magnitude of forward current which the power MOSFET can safely and reliably control.

In summary, the present invention, by modifying the physical structure of the typical prior art IGD, provides a new and improved device having cells with reduced well resistances and which are less effected by reverse current crowding. These characteristics have the net effect of increasing the magnitude of the reverse current which each cell, and hence the IGD, can accommodate before entering a latched, uncontrollable state of operation. Because the reverse current varies in part as a function of the main device current and shows substantial increases during device turn off, the present invention has the net effect of increasing the magnitude of main device current which an IGD can reliably gate control and turn off.

While the embodiments of the invention have been illustrated and described as having elongated, rectangular contact windows and cells, it will be appreciated by those skilled in the art that the benefits derived from increasing the ratio of base to emitter surface area disposed in ohmic contact with an emitter electrode are achievable with contact windows and underlying cells having other geometries. That is, as long as the base/emitter region surface area ratio is not less than ⅓, substantial decreases in device well resistance will result. Further, the feature of situating the base region end portions such that their surfaces are coextensive with the window ends in the rectangular cells, shown in all of the embodiments described herein, can be implemented with any rectangular contact window regardless of the ratio of emitter/base region surface area. This feature will diminish the effects of reverse current crowding, thereby improving the characteristics of the IGT in the manner described herein.

It will be obvious to those skilled in the art that, while embodiments of the invention have been described with reference to devices including various regions having selected conductivity types, the invention is equally applicable to devices having regions of opposite conductivity types, i.e. where the P and N conductivity types and the resultant hole and electron current flows are reversed. Further, as described above, the device terminology used to describe IGTs has corresponding terminology with respect to the power MOSFETs mentioned above. Thus, claim language phrased in IGT terminology is intended to include the MOSFET equivalents.

While the present invention has been shown and described with reference to preferred embodiments, it will be understood that numerous modifications, changes, variations, substitutions and equivalents will occur to those skilled in the art without departing from the spirit and scope of the invention. Accordingly, it is intended that the invention herein be limited only by the scope of the appended claims.

What is claimed is:

1. A semiconductor device formed in and on a substrate having a major surface, said device comprising:
    a first region within said substrate of a first conductivity type, said first region having a first surface area adjacent said major surface;
    a second region within said substrate of a second conductivity type opposite of said first conductivity type, said second region bounding said first region within said substrate and having a second surface area adjacent said major surface;
    an insulating layer disposed over said first and second surface areas, said insulating layer including a contact window formed in said insulating layer over a first portion of said first surface area and a second portion of said second surface area which is adjacent to and extends along said first portion of the first surface area, the ratio of the area of said second portion to the area of said first portion being greater than or equal to one-third, and said contact window having at least part of its edge located over said second surface area;
    a first electrode layer disposed in said contact window and making ohmic contact with said first and second portions of said first and second regions respectively; and
    a gate electrode overlying a portion of said insulating layer.

2. The semiconductor device of claim 1 wherein said contact window is substantially rectangularly shaped and includes a pair of longitudinal sides and a pair of transverse ends, the ratio of the length of said sides to the length of said ends being greater than or equal to twenty.

3. The semiconductor device of claim 1 further comprising:
    a third region within said substrate of said first conductivity type adjacent said second region:
    a fourth region within said substrate of said second conductivity type in contact with said third region;
    a gate electrode disposed on said insulating layer and over a part of said second region which is between said first and third regions; and
    a second electrode layer making ohmic contact with said fourth region.

4. The semiconductor device of claim 3 wherein said first region, said second region, said insulating layer, said first electrode layer and said gate electrode comprise a first cell, said device further comprising one or more additional cells each substantially identical to said first cell and all having their first electrode layers connected together and their gate electrodes connected together.

5. A semiconductor device formed in and on a substrate having a major surface, said device comprising:
    a first region within said substrate of a first conductivity type, said first region having a first surface area adjacent said major surface;
    a second region within said substrate of a second conductivity type opposite of said first conductivity type, said second region bounding said first region within said substrate and having a second surface area adjacent said major surface;
    an insulating layer disposed over said first and second surface area, said insulating layer including a contact window formed in said insulating layer over a first portion of said first surface area and a second portion of said second surface area which is adjacent to and extends along said first portion of the first surface area, said second portion including sections of said second surface area which are spaced from the junction between said first and second regions so as to reduce crowding of current flowing in said second region to said contact window;
    a first electrode layer disposed in said contact window and making ohmic contact with said first and second portions of said first and second regions, respectively; and
    a gate electrode overlying a portion of said insulating layer.

6. The semiconductor device of claim 5 wherein said contact window is substantially rectangularly shaped and includes a pair of longitudinal sides and a pair of transverse ends, said second portion of said second surface area including a pair of end portions, each end portion being adjacent and coextensive with a respective transverse end of said contact window.

7. The semiconductor device of claim 6 wherein each of said end portions is substantially rectangular in shape.

8. The semiconductor device of claim 6 wherein said first portion of said first surface area includes a pair of side portions, each proximate to a respective longitudinal side of said contact window, and wherein said second portion of said second surface area further includes a center portion disposed between said pair of side portions of said first surface area.

9. The semiconductor device of claim 8 wherein said first portion of said first surface area includes at least one bridge portion interconnecting said side portions and interrupting said center portion.

10. The semiconductor device of claim 8 wherein said side portions are each comprised of a plurality of longitudinally spaced segments, and wherein said center portion includes lateral extensions between successive segments in each of said side portions.

11. The semiconductor device of claim 10 wherein said first portion of said first surface area further includes at least one bridge portion interconnecting a segment from one side portion with a respective segment from the other side portion.

12. The semiconductor device of claim 5 wherein the ratio of the area of said second portion to the area of said first portion is greater than or equal to one-third.

13. The semiconductor device of claim 5 further comprising:

a third region within said substrate of said first conductivity type adjacent said second region;

a fourth region within said substrate of said second conductivity type in association with said third region;

a gate electrode disposed on said insulating layer and over a part of said second region which is between said first and third regions; and a second electrode layer making ohmic contact with said fourth region.

14. The semiconductor device of claim 13 wherein said first region, said second region, said insulating layer, said first electrode layer and said gate electrode comprise a first cell, said device further comprising one or more additional cells each substantially identical to said first cell and all having their first electrode layers connected together and their gate electrodes connected together.

* * * * *